United States Patent [19]

Itaya et al.

[11] Patent Number: 5,389,800
[45] Date of Patent: Feb. 14, 1995

[54] SEMICONDUCTOR LIGHT-EMITTING DEVICE

[75] Inventors: Kazuhiko Itaya, Goleta, Calif.; Genichi Hatakoshi, Yokohama, Japan

[73] Assignee: Kabushiki Kaisha Toshiba, Kawasaki, Japan

[21] Appl. No.: 128,113

[22] Filed: Sep. 29, 1993

[30] Foreign Application Priority Data

Sep. 29, 1992 [JP] Japan .................. 4-259634

[51] Int. Cl.[6] .................. H01L 29/161; H01L 29/205; H01L 33/00
[52] U.S. Cl. .................. 257/94; 257/99; 472/44; 472/45
[58] Field of Search .................. 257/94, 99, 96, 97; 372/45, 46, 43, 44

[56] References Cited

U.S. PATENT DOCUMENTS 5,138,404  8/1992  Ishikawa et al. .................. 357/16

FOREIGN PATENT DOCUMENTS 1-169985   7/1989  Japan .................. 372/45
1-296687  11/1989  Japan .................. 372/45

Primary Examiner—Jerome Jackson
Assistant Examiner—Donald L. Monin, Jr.
Attorney, Agent, or Firm—Oblon, Spivak, McClelland, Maier & Neustadt

[57] ABSTRACT

According to the present invention, there is provided a semiconductor light-emitting device including a light-emitting layer having a first semiconductor layer, and formed on a main surface of one side of a semiconductor substrate, an upper-most layer of the light-emitting layer made of a compound semiconductor containing elements from the group II and group VI of the periodic table, the second semiconductor layer formed on the first semiconductor layer, and made of a material having a lattice constant different from that of the material of the semiconductor substrate by at least 2%, the second semiconductor layer having a film thickness of a critical film thickness, the first electrode formed on a main surface of the other side of the semiconductor substrate, and the second electrode formed on the second semiconductor layer.

16 Claims, 4 Drawing Sheets

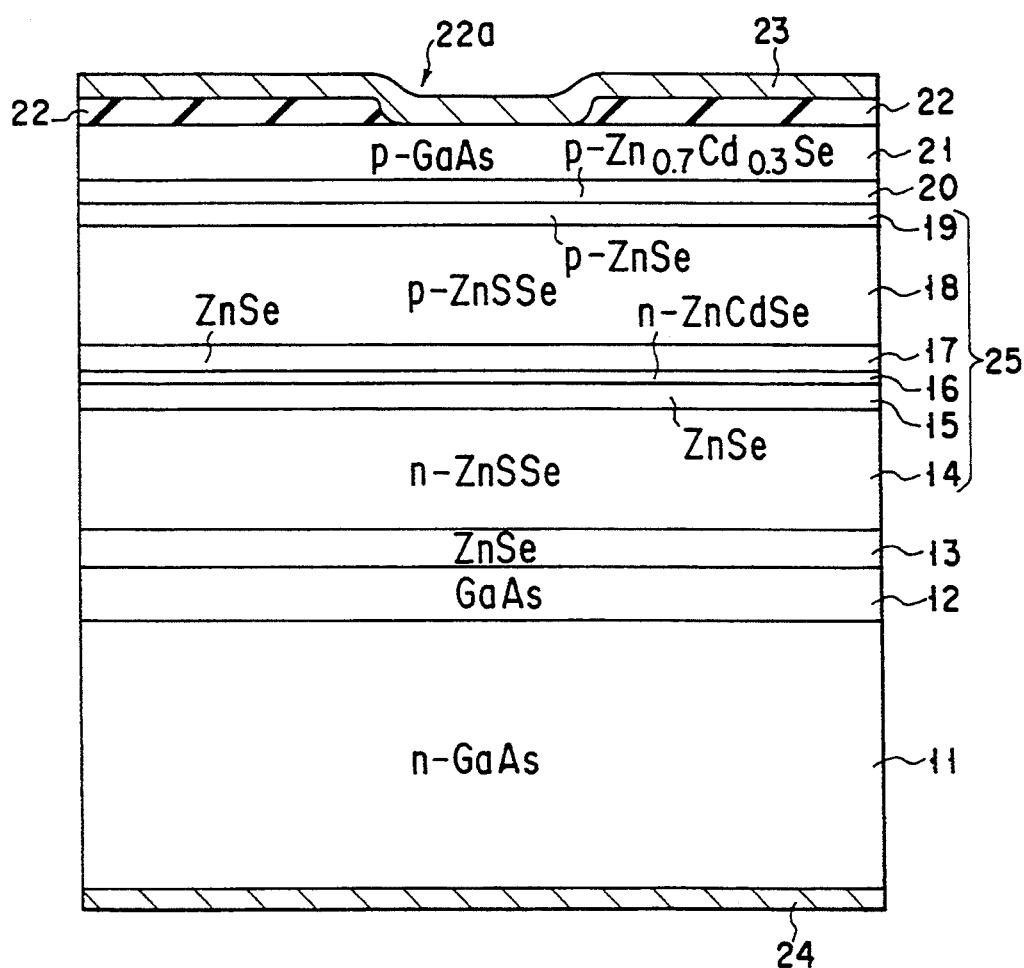
F I G. 1

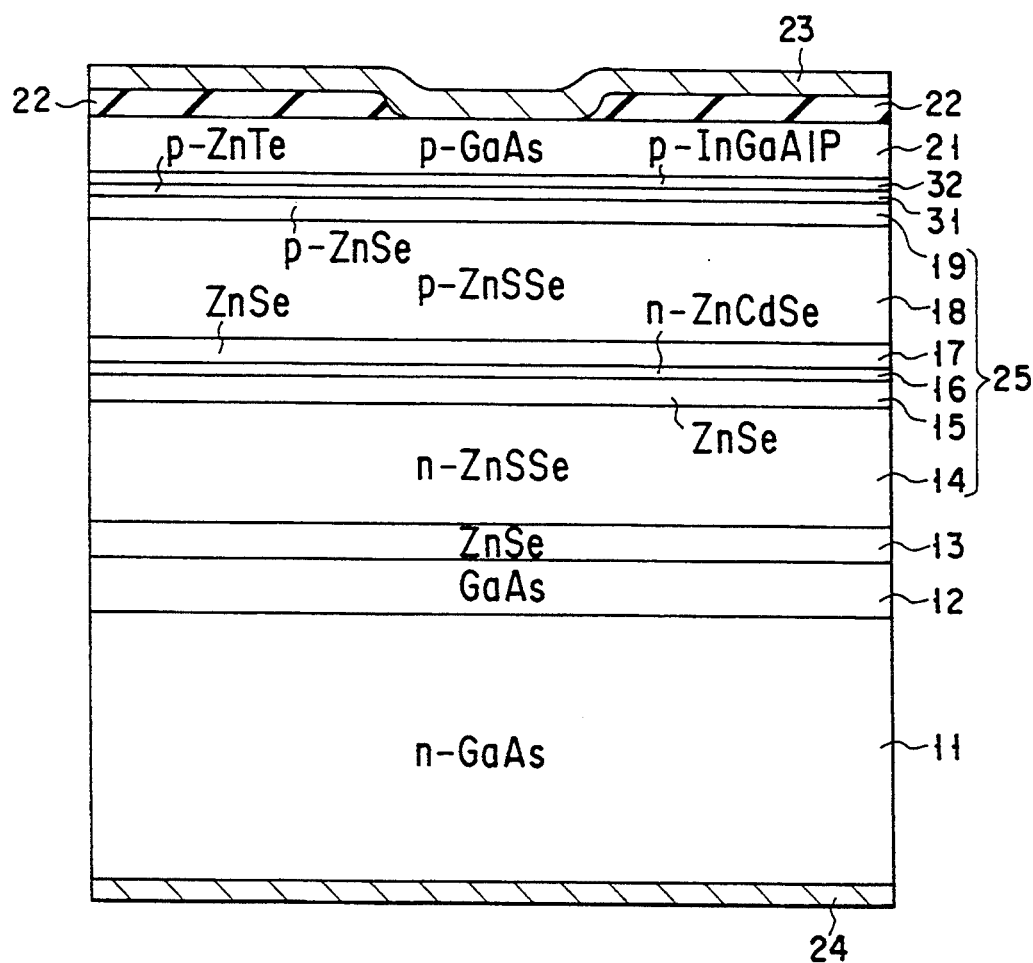
F I G. 3

SEMICONDUCTOR LIGHT-EMITTING DEVICE

BACKGROUND OF THE INVENTION

1. Field of the Invention

The present invention relates to a semiconductor light-emitting device.

2. Description of the Related Art

These days, development of semiconductor lasers has remarkably progressed so as to be applied to the light source of the optical data processing device such as an optical disk system, or high-speed laser printer. As the density of the optical disk increases, the demand of the laser having a shorter oscillating wavelength is being raised, and therefore the development of this field is greatly promoted.

A conventional semiconductor laser prepared by forming an InGaAlP semiconductor layer on a GaAs substrate, has an oscillating wavelength of 0.6 $\mu$m, and a laser output of about 20 mW, and is already used in practice. When the semiconductor laser of this type is used as a light source of an optical disk system, the recording density is improved by only 1.4 times as compared to the case of a semiconductor laser having GaAlAs semiconductor layer. Such a laser is not sufficient as a light source used for a high-density recording operation.

A semiconductor laser made of a compound semiconductor containing elements from the group II and group VI of the periodic table such as ZnSe has an oscillating wavelength of about 0.5 $\mu$m, and is able to emit blue light. Further, in the case where the semiconductor laser is used as a light source of an optical disk system, the recording density is increased by 3 times as compared to the case where a GaAlAs semiconductor laser is used. Thus, the development of semiconductor laser by use of a ZnSe compound semiconductor is greatly promoted.

In general, a p-type ZnSe compound semiconductor entails a drawback that a good ohmic contact cannot be obtained between ZnSe and a metal electrode. In order to solve this drawback, there is a technique in which a contact layer made of, for example, GaAs, is provided between the ZnSe layer and the metal electrode. However, the semiconductor laser having the above-described structure involves a large band gap difference between the energy of ZnSe, 2.7 ev, and that of GaAs, 1.4 eV. Such a large band gap difference causes a hetero-spike in the valence band, which acts as a barrier for injected holes. As a result, a significant voltage drop occurs on the hetero contact interface between ZnSe and GaAs, thereby excessively increasing the operating voltage.

SUMMARY OF THE INVENTION

The purpose of the invention is to provide a semiconductor light-emitting device which involves a smooth injection of holes from the electrode to the ZnSe layer of the p side, and which has a low operating voltage.

The above-described purpose can be achieved by a semiconductor light-emitting device comprising: a light-emitting region having a first semiconductor layer, formed on a main surface of one side of a semiconductor substrate, an upper-most layer of the light-emitting layer made of a compound semiconductor containing elements from the group II and group VI of the periodic table; the second semiconductor layer formed on the first semiconductor layer, and made of a material having a lattice constant different from that of the material of the semiconductor substrate by at least 2%, the second semiconductor layer having a film thickness of a critical film thickness; the first electrode formed on a main surface of the other side of the semiconductor substrate; and the second electrode formed on the second semiconductor layer.

According to the present invention, in the semiconductor light-emitting device comprising the first semiconductor layers made of a compound semiconductor containing elements from the group II and group VI of the periodic table, the second semiconductor layer made of a material having a distortion of at least 2% in terms of the lattice constant ratio to that of the semiconductor substrate, is interposed between the light-emitting layer and the electrode with this structure, heavy holes and light holes are separated from each other due to the distortion. Thus, a good coupling of positive holes can be achieved between the second semiconductor layer and the first semiconductor layer containing elements from the group II and group VI of the periodic table, thereby reducing creating a hetero barrier, which smoothes the injection of holes. Consequently, the holes injected from the electrode are smoothly injected to the light-emitting layer, thereby reducing the operation voltage of the semiconductor light-emitting device to a sufficiently low level.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross section of an embodiment of a semiconductor light-emitting device according to the present invention;

FIG. 3 is another embodiment of the semiconductor light-emitting device according to the present invention.

DETAILED DESCRIPTION OF THE PREFERRED EMBODIMENTS

Figures 2A, 2B, 2C:
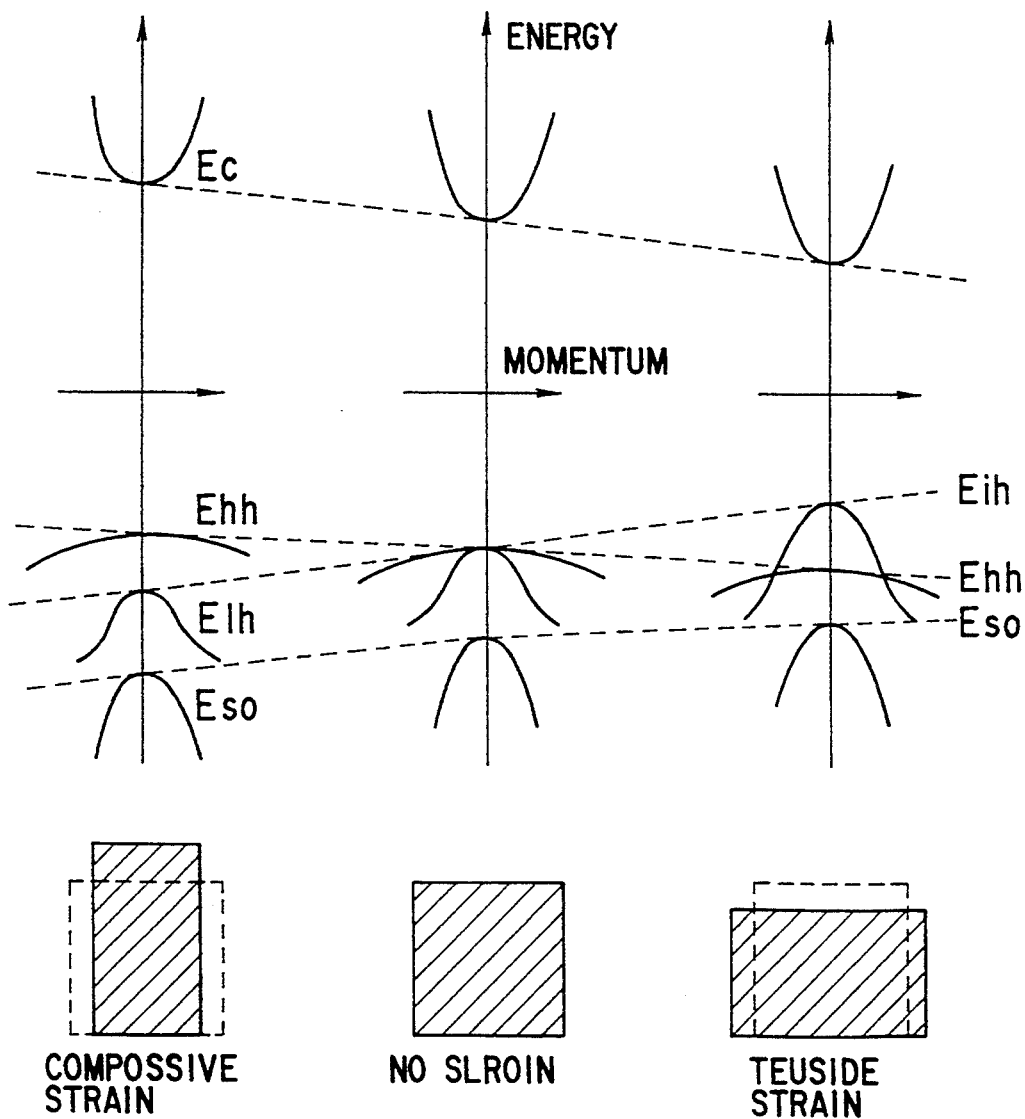
FIGS. 2A to 2C are comparison diagrams illustrating the change in band structure of the semiconductor with and without strain.

Embodiments of the present invention will now be described with reference to accompanying drawings.

FIG. 1 is a cross section of a semiconductor laser, which is an embodiment of the semiconductor light-emitting device according to the present invention. In this figure, numeral 11 denotes an n-type GaAs substrate. On the main surface of one side of the n-type GaAs substrate 11, an n-type GaAs buffer layer 12 having a thickness of 1 $\mu$m, and an n-type ZnSe buffer layer 13 having a thickness of 1 μm are formed in this order. On the n-type ZnSe buffer layer 13, there is provided light-emitting layers 25. The light-emitting layers 25 have a double hetero structure including, from the bottom, an n-type ZnSSe cladding layer 14 having a thickness of 2 μm, a ZnSe optical guide layer 15 having a thickness of 0.1 μm, an n-type ZnCdSe active layer 16 having a thickness of 0.01 μm, a ZnSe optical guide layer 17 having a thickness of 0.1 μm, a p-type ZnSSe cladding layer 18 having a thickness of 2 μm, and a p-type ZnSe growth protection layer 19 having a thickness of 0.5 μm, which serve as the first semiconductor layers made of a compound semiconductor containing elements from the groups II and vI of the periodic table. The emission of light occurs by the carrier recombination at the active layer. Here, the cladding layers serve to confine carriers and light, and other than ZnSSe, for example, ZnMgSSe can be used. The growth protection layer serves to protect the interface of the regrowth layer, and other than ZnSe, for example, ZnSSe, can be used as a compound semiconductor containing elements from the groups II and VI of the periodic table.

On the light-emitting layers 25, there is formed a p-type $Zn_{0.7}Cd_{0.3}Se$ semiconductor layer 20 having a thickness of 50 Å, and serving as the second semiconductor layer. On the p-type $Zn_{0.7}Cd_{0.3}Se$ semiconductor layer 20, there is formed a p-type GaAs semiconductor layer 21, which serves as the third semiconductor layer, having a thickness of 1 μm, and made of a compound semiconductor containing elements from the groups III and V of the periodic table. On the p-type GaAs semiconductor layer 21, there is formed a dielectric film 22 made of, for example, $SiO_2$, having an opening 22a, and a thickness of 0.5 μm. On the dielectric film 22, and in the opening 22a, there is formed the first metal electrode 23 made of Ti/Au and having a thickness of 200 Å/0.3 μm. On the main surface of the other side of the semiconductor substrate 11, there is formed the second electrode 24 made of AuGe/Au and having a thickness of 1000 Å/2000 Å.

Except for the first and second metal electrodes 23 and 24, all the layers are formed by the molecular beam epitaxy method. In the semiconductor laser of the above-described type, the dielectric film 22 is designed to carry out a current confinement.

In the semiconductor laser having the above-described structure, the thickness of the p-type $Zn_{0.7}Cd_{0.3}Se$ semiconductor layer 20 serving as the second semiconductor layer must be set lower than the critical thickness. This is because if the film thickness exceeds the critical thickness, 40 Å. The critical film thickness can be defined as the maximum film thickness with which lattices can be continuously jointed together in a distorted manner without causing dislocation during the growth of the second semiconductor layer. Further, the composition of the $Zn_{1-x}Cd_xSe$ semiconductor should preferably be $0.2 \leq x \leq 0.5$ in consideration of heterobarrier reduction effect.

For the second semiconductor layer, a material having a lattice constant different from that of the material of the semiconductor substrate, by at least 2%, preferably 2 to 5%, more specifically, a material in which at least 2% of lattice mismatch value is introduced in the crystal lattice. This is because if the distortion is less than 2%, the effect obtained by the introduction of the strain is poor, whereas if it exceeds 5%, the dislocation occurs.

Regarding the second semiconductor layer having a strain introduced as above, and a film thickness of the critical thickness or less, the relationship between the band gap and the operating voltage will now be described.

FIG. 2B shows a band diagram in the case where no strain is applied, i.e. no distortion introduced. When a strain is introduced to a crystal, the band structure on the valence band side varies. In the case where a compressive strain is applied as shown in FIG. 2A, or a tensile strain is applied as shown in FIG. 2B, the heavy hole level Ehh and the light hole level Eih are separated from each other due to the strain. By forming the second semiconductor layer having the distortion introduced, such as to be brought into contact with the p-type ZnSe growth protection layer 29, which is the first semiconductor layer, the holes can easily be injected from the p-type ZnSe growth protection layer 29 to the second semiconductor layer. More specifically, in the case of the compressive strain shown in FIG. 2A, the light hole band separated becomes close to the valence band edge position of ZnSe, enhancing the resonance effect and the tunnel effect of the level. Further, in the case of the tensile strain shown in FIG. 2C, the light hole level Eih exceeds out on the forbidden band side, increasing the mobility.

Regarding a semiconductor laser having the abovedescribed structure, when the cavity length was set at 400 μm, and the temperature was at room temperature, the laser oscillated continuously at a threshold current of 80 mA. The resistance of the element was 15Ω, and the voltage at a laser output of 20 mW was as low as 3.8 v. As a comparison, a semiconductor laser was prepared by forming a p-type GaAs semiconductor layer directly on the p-type znse growth protection layer 18, and the voltage of the laser at 20 mW was 10 V. Thus, the operating voltage of the semiconductor laser of the embodiment was made about ⅓ as compared to the conventional one.

This embodiment involves a case where $Zn_{0.7}Cd_{0.3}Se$ is used as the material for the second semiconductor layer. The lattice constant of this material is larger than that of GaAs used as a material of the GaAs semiconductor substrate, and such a material has a band structure for the compressive strain type shown in FIG. 2A. With this structure, the distortion amount is 3% or more. In this case, what is important is whether or not a dislocation or the like occurs. Since the second semiconductor layer is made thin as 50 Å, which is thinner than the critical film thickness, 150 Å, and the layer is brought into contact with the p-type ZnSe growth protection layer 19 serving as the first semiconductor layer while the compressive strain being applied thereto, no dislocation or the like occurs.

When a compound semiconductor containing the groups II and VI elements is used as the material for the second semiconductor layer as in the above embodiment, a good morphology can be achieved when forming the second semiconductor layer, and the temperature during the formation thereof can be set at the same as the formation temperature for the light-emitting layer.

In the embodiment, between the first electrode 23 and the second semiconductor layer, there is provided a GaAs layer 32 serving as the third semiconductor layer, and made of a compound semiconductor containing elements from the III and V groups of the periodic table. As can be easily alloyed with Au or the like into an alloy layer, and therefore the GaAs layer 21 and the first metal electrode 23 are brought into contact with each other in an ohmic contact manner at low resistance. With the above-described structure, the contact resistance caused by the hetero spike of the balance band between GaAs and ZnSe, which is a compound semiconductor containing elements from the groups II and VI of the periodic table, can be reduced, thereby achieving a good voltage characteristic. This is because as the hetero spike of the balance band decreases, the resonance effect and the tunnel effect of the level increases.

In the embodiment, GaAs is used since it was a high-quality material for a semiconductor substrate, and is able to grow each layer very well, but ZnSe may also be used.

FIG. 3 is a cross section of a semiconductor laser, which is another embodiment of the semiconductor light-emitting device according to the present invention.

On an n-type GaAs substrate 11, there is provided a light-emitting layer 25 via an n-type GaAs buffer layer 12 and an n-type znSe buffer layer 13. The structure of the light-emitting layers 25 is the same as that of the semiconductor laser shown in FIG. 1. Further, on a p-type ZnSe growth protection layer serving as the first semiconductor layer, and provided on the upper surface of the light-emitting layers 25, there is provided a p-type ZnTe semiconductor layer 31 having a thickness of 30 Å and serving as the second semiconductor layer. On the p-type ZnTe semiconductor layer 31, there is provided a p-type InGaAlP semiconductor layer 32 having a thickness of 0.1 μm and serving as the fourth semiconductor layer. It should be noted here that the lattice constant of ZnTe used as the material for the second semiconductor layer differs from that of GaAs used as the material for the GaAs semiconductor substrate by 3%. Further, the thickness of the second semiconductor layer is set at 30 Å, which is lower than the critical film thickness, 100 Å.

As in the case of the semiconductor laser shown in FIG. 1, on the p-type InGaAlP semiconductor layer 32, there are formed a dielectric film 22 and the first metal electrode 23. On the main surface of the other side of the semiconductor substrate 11, there is formed the second metal electrode 24.

As in the case of the semiconductor laser shown in FIG. 1, except for the first and second, metal electrodes 23 and 24, all the layers are formed by the molecular beam epitaxy method. In the semiconductor laser, the dielectric film 22 is designed to carry out a current confinement.

The semiconductor laser thus obtained oscillated continuously under the same conditions as those for the semiconductor laser shown in FIG. 1. The voltage at a laser output of 20 mW was as low as 3.5 V, which was only about $\frac{1}{3}$ of that of the conventional technique.

In this embodiment, the p-type ZnSe semiconductor layer 31 was used as the second semiconductor layer. ZnSe is a useful material for preparation of the laser since, with ZnSe, the p-type can be obtained even in the case of undope. Further, ZnSe contains only two elements, and therefore it is easy to control the composition thereof as compared to ZnCdSe or the like, which contains three elements.

Figure 4:
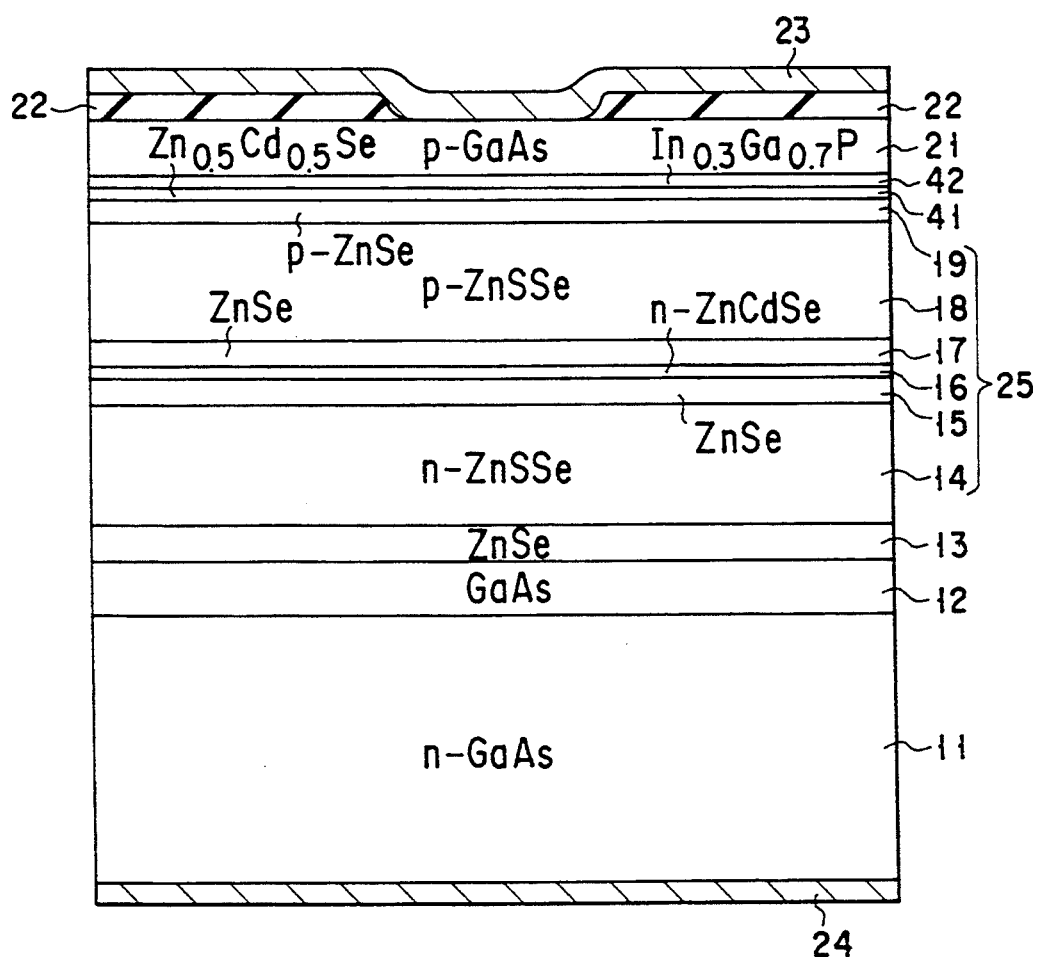
FIG. 4 is another embodiment of the semiconductor light-emitting device according to the present invention.

FIG. 4 is a cross section of a semiconductor laser, which is another embodiment of the semiconductor light-emitting device according to the present invention.

On an n-type GaAs substrate 11, there are provided light-emitting layers 25 via an n-type GaAs buffer layer 12 and an n-type ZnSe buffer layer 13. The structure of the light-emitting layers 25 is the same as that of the semiconductor laser shown in FIG. 1. Further, on a p-type ZnSe growth protection layer 19 serving as the first semiconductor layer, and provided on the upper surface of the light-emitting layers 25, there is provided a p-type $Zn_{0.5}Cd_{0.5}Se$ semiconductor layer 41 having a thickness of 50 Å and serving as the second semiconductor layer. On the semiconductor layer 41, there is provided a p-type $Zn_{0.3}Cd_{0.7}Se$ semiconductor layer 42. It should be noted here that the lattice constant of $Zn_{0.5}Cd_{0.5}Se$ used as the material for the second semiconductor layer differs from that of GaAs used as the material for the GaAs semiconductor substrate by 2%. Further, the thickness of the second semiconductor layer is set at 50 Å, which is lower than the critical film thickness, 100 Å.

The semiconductor laser thus obtained oscillated continuously under the same conditions as those for the semiconductor laser shown in FIG. 1. The voltage at a laser output of 20 mW was as low as 3.2 V, which was only about $\frac{1}{3}$ of that of the conventional technique.

In this embodiment, the composition of InGaP, which is the material for the fourth semiconductor layer is set at $In_{0.3}Ga_{0.7}P$, and the lattice constant thereof is set in the opposite direction to the lattice mismatch of $Zn_{0.5}Cd_{0.5}Se$, thereby compensating the mismatch.

In this embodiment, the structure of only the p-side was restricted such as that the lattice constant of the layer differs from that of the substrate by at least 2%, and the second semiconductor layer having a thickness lower than the critical thickness is provided. However, in the case of the combination of a compound semiconductor layer containing elements from the groups III and V of the periodic table and another compound semiconductor layer containing elements from the groups II and VI, such as GaAs/ZnSe or the like, the hetero barrier is also a problem in the n-side. Therefore, it is preferable that the n-side also has a structure similar to that of the present invention.

The present invention is not limited to the embodiments provided above. For example, ZnSe, which does not contain S, may be used as an active layer, and those to which a strain is introduced, may be used. Further, a material containing As, P, B, N, Zn, Se, and the like, can be used to prepare the active layer and cladding layer.

These embodiments discuss the case where a compressive strain is applied to the second semiconductor layer, but when an AlGaP-type material is used to make the second semiconductor layer, the contact effect can be obtained based on the tensile strain, as in the case of each embodiment described above.

Further, in these embodiments, there is a contact layer made of a compound semiconductor containing elements from the groups III and V in the periodic table, interposed between the second semiconductor layer and the first metal electrode, but it is also possible that the second semiconductor layer and the first metal electrode are directly connected to each other.

In the present invention, at least one element selected from the group consisting of Zn, Cd and Mg is used as the element from the group II of the periodic table, and at least one element selected from the group consisting of S, Se and Te is used as the element from the group VI of the periodic table.

As described, according to the present invention, there is provided a semiconductor light-emitting device made of a compound semiconductor containing elements from the group II and VI of the periodic table, which can be operated at a voltage so low that the device achieves a good temperature characteristic, and a significantly improved light emitting efficiency, and is able to effectively inject carriers into a light-emitting region.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor light-emitting device comprising:
    a light-emitting region having a first semiconductor layer, formed on a main surface of one side of a semiconductor substrate, an upper-most layer of said light-emitting region made of a compound semiconductor containing elements from the group II and group VI of the periodic table;
    a second semiconductor layer formed on said light-emitting region, and made of a material having a lattice constant different from that of the material of said semiconductor substrate by at least 2%, said second semiconductor layer having a film thickness not greater than a critical film thickness;
    a first electrode formed on a main surface of the other side of said semiconductor substrate; and
    a second electrode formed above said second semiconductor layer;
    wherein said second semiconductor layer is made of a compound semiconductor containing elements from the group II and group VI of the periodic table, to which a compressive strain is applied.

2. A semiconductor light-emitting device according to claim 1, wherein said second semiconductor layer is made of a material to which applied is a type of strain selected the group consisting of compressive strain, and tensile strain.

3. A semiconductor light-emitting device according to claim 1, wherein said second semiconductor layer is made of a compound semiconductor containing elements from the group III and group v of the periodic table, to which a tensile strain is applied.

4. A semiconductor light-emitting device comprising:
    a light-emitting region having a first semiconductor layer formed on a main surface of one side of a semiconductor substrate, an upper-most layer of said light-emitting region made of a compound semiconductor containing elements from the group II and group VI of the periodic table;
    a second semiconductor layer formed on said light-emitting region, and made of a material having a lattice constant different from that of the material of said semiconductor substrate by at least 2%, said second semiconductor layer having a film thickness not greater than a critical film thickness;
    a first electrode formed on a main surface of the other side of said semiconductor substrate;
    a third semiconductor layer, which is made of a compound semiconductor containing elements from the group III and group V of the periodic table, formed over said second semiconductor layer; and
    a second electrode formed over the third semiconductor layer.

5. A semiconductor light-emitting device according to claim 4, wherein a fourth semiconductor layer is interposed between said second semiconductor layer and said third semiconductor.

6. A semiconductor light-emitting device according to claim 5, wherein said fourth semiconductor layer is made of a compound semiconductor containing at least In, Ga, and P.

7. A semiconductor light-emitting device according to claim 1, wherein a buffer layer is interposed between said semiconductor substrate and said light-emitting region.

8. A semiconductor light-emitting device according to claim 7, wherein said buffer layer is made of a compound semiconductor containing elements from the group II and group VI of the periodic table.

9. A semiconductor light-emitting device according to claim 7, wherein said buffer layer is made of a compound semiconductor containing elements from the group III and group V of the periodic table.

10. A semiconductor light-emitting device comprising:
    a light-emitting region having a first semiconductor layer, formed on a main surface of one side of a semiconductor substrate, an upper-most layer of said light-emitting region made of a compound semiconductor containing elements from the group II and group VI of the periodic table;
    a second semiconductor layer formed on said light-emitting region, and made of a material having a lattice constant different from that of the material of said semiconductor substrate by at least 2%, said second semiconductor layer having a film thickness not greater than a critical film thickness;
    a first electrode formed on a main surface of the other side of said semiconductor substrate; and
    a second electrode formed over said second semiconductor layer;
    wherein said light-emitting region has a double-hetero structure including a first optical guide layer formed on said first cladding layer, an active layer formed on said first optical guide layer, a second optical guide layer formed on said active layer, a second cladding layer formed on said second optical guide layer, and a growth protection layer formed on said second cladding layer.

11. A semiconductor light-emitting device according to claim 1, wherein said group II element is at least one selected from the group consisting of Zn, Cd and Mg.

12. A semiconductor light-emitting device according to claim 1, wherein said group vI element is at least one selected from the group consisting of S, Se and Te.

13. A semiconductor light-emitting device according to claim 4, wherein said group III element is at least one selected from the group consisting of In, Ga and Al.

14. A semiconductor light-emitting device according to claim 4, wherein said group V element is at least one selected from the group consisting of As and P.

15. A semiconductor light-emitting device according to claim 14, wherein said second semiconductor layer is made of a material to which is applied a type of strain selected from the group consisting of a compressive strain and a tensile strain.

16. A semiconductor light-emitting device according to claim 14, wherein said second semiconductor layer is made of a compound semiconductor containing elements from the group II and group VI of the periodic table, to which a compressive strain is applied.

* * * * *

UNITED STATES PATENT AND TRADEMARK OFFICE
CERTIFICATE OF CORRECTION

PATENT NO. : 5,389,800
DATED : February 14, 1995
INVENTOR(S) : Kazuhiko ITAYA et al.

It is certified that error appears in the above-indentified patent and that said Letters Patent is hereby corrected as shown below:

In the Drawing:

In Fig. 2A, change "COMPOSSIVE STRAIN" to --COMPRESSIVE STRAIN--.

In Fig. 2B, change "NO SLROIN" to --NO STRAIN--.

In Fig. 2C, change "TEUSIDE STRAIN" to --TENSILE STRAIN--.

Signed and Sealed this

Twenty-fifth Day of July, 1995

Attest:

BRUCE LEHMAN

Attesting Officer  Commissioner of Patents and Trademarks